(12) United States Patent
Komori et al.

(10) Patent No.: US 10,036,090 B2
(45) Date of Patent: Jul. 31, 2018

(54) TRAP MECHANISM, EXHAUST SYSTEM, AND FILM FORMATION DEVICE

(71) Applicant: TOKYO ELECTRON LIMITED, Tokyo (JP)

(72) Inventors: Eiichi Komori, Nirasaki (JP); Hironori Yagi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 287 days.

(21) Appl. No.: 14/386,419

(22) PCT Filed: Mar. 28, 2013

(86) PCT No.: PCT/JP2013/059186
§ 371 (c)(1),
(2) Date: Sep. 19, 2014

(87) PCT Pub. No.: WO2013/146982
PCT Pub. Date: Oct. 3, 2013

(65) Prior Publication Data
US 2015/0047565 A1    Feb. 19, 2015

(30) Foreign Application Priority Data

Mar. 29, 2012  (JP) ................................ 2012-077044
Oct. 9, 2012   (JP) ................................ 2012-223867

(51) Int. Cl.
*C23F 1/00*     (2006.01)
*H01L 21/306*   (2006.01)
*C23C 16/44*    (2006.01)
*C23C 16/18*    (2006.01)
(Continued)

(52) U.S. Cl.
CPC .......... *C23C 16/4412* (2013.01); *C23C 16/18* (2013.01); *C23C 16/4405* (2013.01);
(Continued)

(58) Field of Classification Search
CPC .................................................. C23C 16/4412
(Continued)

(56) References Cited

U.S. PATENT DOCUMENTS 5,422,081 A * 6/1995 Miyagi .................... B01D 8/00
                                                422/168
5,819,683 A * 10/1998 Ikeda ..................... B01D 53/34
                                                118/715

(Continued)

FOREIGN PATENT DOCUMENTS

JP   08-083773 A   3/1996
JP   08-172083 A   7/1996
(Continued)

OTHER PUBLICATIONS

International Search Report dated Jun. 24, 2013 corresponding to application No. PCT/JP2013/059186.

*Primary Examiner* — Keath T Chen
(74) *Attorney, Agent, or Firm* — Nath, Goldberg & Meyer; Jerald L. Meyer

(57) ABSTRACT

A trap mechanism is provided in the middle of an exhaust passage through which an exhaust gas, which is exhausted from a film formation device body that forms a thin film on the surface of a workpiece (W), flows, and recovers a gas to be collected that is contained in the exhaust gas by cooling and liquefying the gas to be collected. The trap mechanism includes: a housing having a gas inlet and a gas outlet; a partitioning member that partitions the inside of the housing into retention spaces; communication paths that communicate the retention spaces with one another; and cooling jackets that cool the communication paths to cool the exhaust gas. With this structure, the exhaust gas is adiabatically expanded while being cooled, and the gas to be collected is efficiently cooled and liquefied.

17 Claims, 8 Drawing Sheets

(51) Int. Cl.
  *F28B 9/08* (2006.01)
  *H01L 21/67* (2006.01)
  *B08B 9/00* (2006.01)
(52) U.S. Cl.
  CPC ............ *F28B 9/08* (2013.01); *B08B 9/00* (2013.01); *H01L 21/67017* (2013.01); *Y02C 20/30* (2013.01); *Y02P 70/605* (2015.11)
(58) Field of Classification Search
  USPC .................................................. 118/715
  See application file for complete search history.

(56) References Cited

U.S. PATENT DOCUMENTS

| | | | | |
|---|---|---|---|---|
| 6,149,729 | A * | 11/2000 | Iwata | C23C 16/4412 118/715 |
| 6,332,925 | B1 * | 12/2001 | Noji | B01D 53/002 118/715 |
| 7,044,997 | B2 * | 5/2006 | Mardian | B01D 5/0006 55/282.2 |
| 7,491,292 | B2 * | 2/2009 | Han | C23C 16/4412 156/345.29 |
| 7,867,312 | B2 * | 1/2011 | Engerran | C23C 16/4486 55/318 |
| 2002/0088398 | A1 * | 7/2002 | Hsieh | C23C 16/401 118/715 |
| 2006/0144234 | A1 * | 7/2006 | Komatsu | C23C 16/4412 95/288 |
| 2009/0107091 | A1 * | 4/2009 | Cho | C23C 16/4412 55/434.2 |
| 2009/0217634 | A1 * | 9/2009 | Choi | B01D 45/08 55/426 |

FOREIGN PATENT DOCUMENTS

| | | |
|---|---|---|
| JP | 2001-297988 A | 10/2001 |
| JP | 2001-342566 A | 12/2001 |

\* cited by examiner

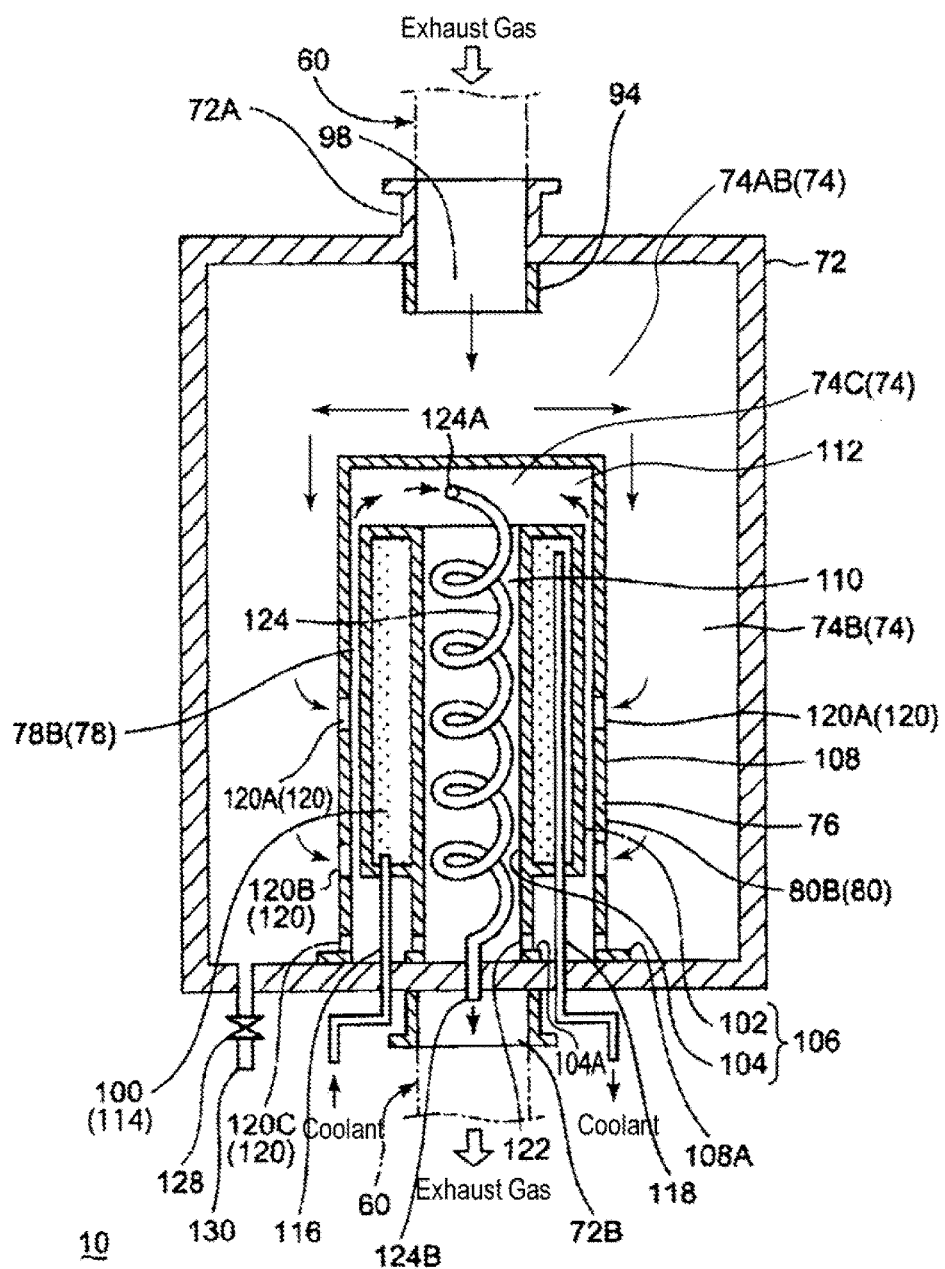

TRAP MECHANISM, EXHAUST SYSTEM, AND FILM FORMATION DEVICE

This is a National Phase Application filed under 35 U.S.C. 371 as a national stage of PCT/JP2013/059186, filed Mar. 28, 2013, an application claiming the benefit from JP2012-077044 filed Mar. 29, 2012, and JP2012-223867 filed Oct. 9, 2012, each of which the content of which is hereby incorporated by reference in its entirety.

TECHNICAL FIELD

The present disclosure relates to a film formation device for forming a film on a workpiece such as a semiconductor wafer or the like using a source gas, an exhaust system and a trap mechanism used in the exhaust system.

BACKGROUND

In general, a step of forming a thin film on a surface of a semiconductor wafer, an LCD substrate or the like and a step of etching the thin film into a desired pattern are repeatedly performed, in order to form an integrated circuit such as an IC or the like, or a logic element.

In a film formation step performed by a film formation device, a specified process gas (source gas) is caused to react within a processing vessel, whereby a thin film of silicon, a thin film of silicon oxide or silicon nitride, a thin film of metal, or a thin film of metal oxide or metal nitride is formed on a surface of a workpiece. An extra reaction byproduct is generated simultaneously with a film formation reaction. The extra reaction byproduct or an unreacted process gas is discharged together with an exhaust gas.

The reaction byproducts contained in the exhaust gas or the unreacted process gas, if directly discharged to the atmosphere, may cause environmental pollution, etc. In order to prevent this situation, it is typical to install a trap mechanism interposed in-between an exhaust system extending from a processing vessel. Thus, the reaction byproduct contained in the exhaust gas or the unreacted process gas is collected and removed.

Depending on the characteristics of the reaction byproduct or the like to be collected and removed, the trap mechanisms of various configurations are proposed. In case of removing a reaction byproduct condensed (liquefied) or coagulated (solidified) at a normal temperature, a trap mechanism is configured by, e.g., a plurality of fins installed within a housing having an exhaust gas inlet and an exhaust gas outlet. The fins are sequentially disposed along a flow direction of an exhaust gas. When the exhaust gas passes through between the fins, the reaction byproduct or the like within the exhaust gas is attached to the surface of the fins and thereby collected. In order to increase collection efficiency, the fins are sometimes cooled by a coolant (see, e.g., Japanese Patent Laid-open Publication Nos. 08-083773 and 08-172083). There is also known a trap mechanism in which an exhaust gas is cooled by allowing the same to flow through a spiral pipe of a first trap and a liquid-phase reaction byproduct is collected by a second trap provided with cooling fins (see, e.g., Japanese Patent Laid-open Publication No. 2001-297988).

In recent years, with a view to reducing a wiring resistance or a contact resistance, a thin film which contains a precious metal such as silver, gold, ruthenium or the like is formed by a film formation device using a raw material (source gas), such as an organic metal compound or the like containing the precious metal. In this case, a byproduct including an unreacted raw material is recovered by cooling and condensing an exhaust gas. Then, the unreacted raw material is recovered by purifying the byproduct (see, e.g., Japanese Patent Laid-open Publication No. 2001-342566).

The above-mentioned trap mechanisms have a difficulty in efficiently cooling a gas of a material, which is low in vapor pressure and thereby relatively hard to be liquefied, up to a temperature at which the gas can be collected. Thus, the trap mechanisms suffer low collection efficiency.

SUMMARY

The present disclosure provides some embodiments of a trap mechanism, an exhaust system and a film formation device, which can efficiently cool and liquefy a collection target gas and which can efficiently collect a collection target substance, by changing an exhaust conductance and adiabatically expanding an exhaust gas, while cooling the exhaust gas.

According to one embodiment of the present disclosure, there is provided a trap mechanism located at an intermediate portion of an exhaust path through which an exhaust gas discharged from a film formation device body configured to form a thin film on a surface of a workpiece flows, the trap mechanism being configured to cool, liquefy and recover a collection target gas contained in the exhaust gas and the trap mechanism including: a housing having a gas inlet and a gas outlet; a partitioning member configured to divide an inside of the housing into a plurality of retention (reservoir) spaces; a communication path configured to bring the retention (reservoir) spaces into communication with one another; and a cooling jacket unit configured to cool the communication path to thereby cool the exhaust gas.

According to the trap mechanism, the exhaust gas is caused to sequentially flow into the respective retention spaces through the communication paths. Thus, while cooling the exhaust gas, the exhaust gas is adiabatically expanded by changing the exhaust conductance. This makes it possible to efficiently cool and liquefy the collection target gas and to efficiently collect the collection target matter.

According to another embodiment of the present disclosure, there is provided an exhaust system through which an exhaust gas discharged from a film formation device body configured to form a thin film on a surface of a workpiece flows, the exhaust system including: an exhaust path connected to an exhaust port of the film formation device body; a vacuum pump installed and interposed at an intermediate portion of the exhaust path; the aforementioned trap mechanism located at the intermediate portion of the exhaust path at an upstream side of the vacuum pump; a bypass path connected to the intermediate portion of the exhaust path so as to avoid (detour) the trap mechanism; and an inert gas supply unit, when the exhaust gas is caused to flow through the bypass path, configured to supply an inert gas having a pressure higher than the pressure of the exhaust gas, into the exhaust path between a gas inlet of the trap mechanism and a connection portion existing at an upstream side of the bypass path and into the exhaust path between a gas outlet of the trap mechanism and a connection portion existing at a downstream side of the bypass path.

According to the exhaust system mentioned above, when the exhaust gas flows through the bypass path, an inert gas having a pressure higher than the pressure of the exhaust gas is supplied to the upstream side and the downstream side of the trap mechanism. It is therefore possible to prevent even a small amount of the exhaust gas (e.g. cleaning gas) flowing through the bypass path from being introduced into the trap mechanism.

According to another embodiment of the present disclosure, there is provided a film formation device of forming a thin film on a surface of a workpiece, including: a film formation device body including a processing vessel capable of being vacuum-exhausted; a mounting stand structure configured to mount the workpiece thereon; a gas introduction unit configured to introduce a gas into the processing vessel; a gas supply system connected to the gas introduction unit and configured to supply the gas to the gas introduction unit; and the aforementioned exhaust system configured to exhaust an internal atmosphere of the processing vessel.

BRIEF DESCRIPTION OF THE DRAWINGS

FIG. 8 is a vertical sectional view illustrating a trap mechanism according to another embodiment of the present disclosure.

DETAILED DESCRIPTION

Embodiments of a trap mechanism, an exhaust system and a film formation device according to the present disclosure will now be described in detail with reference to the accompanying drawings. Description will be made by, as an example, a case where a source gas is generated by gasifying an organic metal compound, such as $Ru(EtCp)_2$, RuCpBuCp, RuCpPrCp, $Ru(nbd)(iHD)_2$ or the like, which is liquid at room temperature, a thin film of metal Ru is formed by using the source gas, and an unreacted source gas as a collection target gas existing in an exhaust gas is liquefied and recovered.

Figure 1:
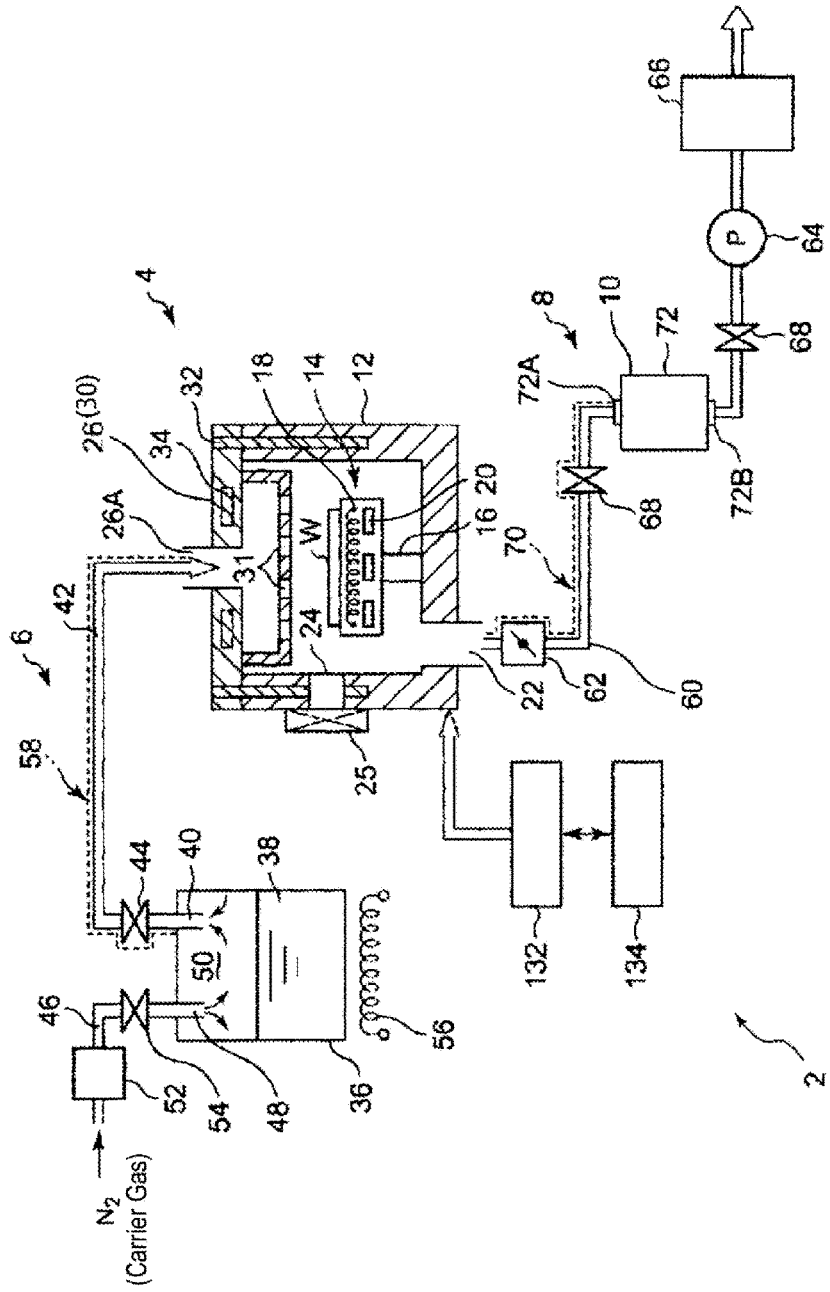
FIG. 1 is a schematic configuration diagram illustrating a film formation device according to one embodiment of the present disclosure.

As shown in FIG. 1, a film formation device 2 mainly includes a film formation device body 4 configured to perform a film formation process with respect to a disc-shaped semiconductor wafer W as a workpiece, a gas supply system 6 configured to supply a required gas including a source gas for film formation to the film formation device body 4, an exhaust system 8 configured to discharge an exhaust gas from the film formation device body 4, and a trap mechanism 10 installed at the exhaust system 8.

First, the film formation device body 4 will be described. The film formation device body 4 includes a tubular processing vessel 12 made of, e.g., an aluminum alloy. Inside the processing vessel 12, a mounting stand structure 14 configured to mount and hold a semiconductor wafer W as a workpiece is installed. The mounting stand structure 14 as a whole is formed into, e.g., a disc shape. The mounting stand structure 14 is configured to mount the semiconductor wafer W on the top surface thereof. The mounting stand structure 14 is installed and fixed at a top end portion of a metal-made post 16 which extends upward from the bottom portion of the processing vessel 12 and which is made of, e.g., an aluminum alloy.

A heater 18 as a heating unit, which is formed of, e.g., a tungsten wire heater or a carbon wire heater, is embedded in the upper portion of the mounting stand structure 14. The heater 18 is configured to heat the semiconductor wafer W. Below the heater 18, a coolant path 20 is formed, through which a coolant for cooling, as well as controlling the temperature of, the lower or side portion of the mounting stand structure 14. In the mounting stand structure 14, there are installed lifter pins (not shown) moving up and down during the course of loading and unloading the semiconductor wafer W and performing the delivery of the semiconductor wafer W between themselves and a transfer arm.

An exhaust port 22 is formed at the bottom portion of the processing vessel 12. The exhaust system 8 is connected to the exhaust port 22 and configured to vacuum-exhaust the internal atmosphere of the processing vessel 12. The exhaust system 8 will be described later. A gate 24 through which the semiconductor wafer W is loaded and unloaded is formed at the sidewall of the processing vessel 12. A gate valve 25 configured to open and air-tightly close the gate 24 is installed at the gate 24.

A gas introduction unit 30 formed of, e.g., a shower head 26, is installed at the ceiling portion of the processing vessel 12. The gas introduction unit 30 is configured to supply a required gas into the processing vessel 12 through gas spray holes 31 formed at the lower surface thereof. Heaters 32 and 34 are respectively installed at the sidewall of the processing vessel 12 and at the shower head 26. The heaters 32 and 34 are configured to keep the sidewall of the processing vessel 12 and the shower head 26 at a predetermined temperature, thereby preventing liquefaction of a source gas. The gas supply system 6 is connected to a gas inlet 26A of the shower head 26.

In FIG. 1, there is shown only the gas supply system for supplying a raw material. For example, if a purge gas is needed, a purge gas supply system may be connected to the processing vessel 12. If other gases are needed, other gas supply systems may be connected to the processing vessel 12. Depending on the kinds of gases used, the shower head 26 may be a pre-mix type shower head within which a source gas and another gas are mixed with each other, or a post-mix type shower head, the inside of which is divided such that a source gas and another gas are independently introduced into the processing vessel 12 and then mixed within the processing vessel 12. While the shower head 26 is used as the gas introduction unit 30 in the present embodiment, a nozzle may be used in place of the shower head 26. The gas introduction method is not particularly limited.

Next, the gas supply system 6 will be described. The gas supply system 6 includes a raw material tank 36 configured to retain a solid raw material or a liquid raw material. In the present embodiment, for example, a liquid raw material 38, which is an organic metal compound raw material, is retained within the raw material tank 36. As mentioned above, $Ru(EtCp)_2$, RuCpBuCp, RuCpPrCp, $Ru(nbd)(iHD)_2$ or the like is used as the liquid raw material 38. The liquid raw material 38 is usually very low in vapor pressure and shows a characteristic of being hard to be vaporized.

A source gas generated in the raw material tank 36 can be supplied to the shower head 26 through a raw material path 42, one end of which is connected to a gas outlet 40 formed at the ceiling portion of the raw material tank 36 and the other end of which is connected to the gas inlet 26A of the shower head 26 of the film formation device body 4. An on/off valve 44 is installed and interposed at the portion of the raw material path 42 near the raw material tank 36.

A carrier gas pipe 46 configured to supply a carrier gas to the raw material tank 36 is connected to the ceiling portion of the raw material tank 36. A gas inlet 48 at the downstream end of the carrier gas pipe 46 is inserted into the raw material tank 36 and positioned at an upper space portion 50 of the raw material tank 36. A flow rate controller 52 such as a mass flow controller or the like and a gas on/off valve 54 are sequentially installed at the intermediate portion of the carrier gas pipe 46. The carrier gas is supplied while the flow rate thereof is controlled, and then the liquid raw material 38 is heated. Thus, a source gas is formed by vaporizing the liquid raw material 38. In the present embodiment, an $N_2$ gas is used as the carrier gas. A rare gas such as an Ar gas or the like may be used as the carrier gas.

A tank heating unit 56 configured to heat the raw material tank 36 is installed at the raw material tank 36. The tank heating unit 56 is configured to accelerate vaporization of the liquid raw material 38. In this case, the heating temperature of the raw material tank 36 is set lower than the decomposing temperature of the liquid raw material 38. A path heating heater 58 such as a tape heater or the like is installed at the raw material path 42. The path heating heater 58 is configured to heat the raw material path 42 to a temperature equal to or higher than the liquefying temperature of the source gas, thereby preventing re-liquefaction of the source gas.

Next, the exhaust system 8 will be described. The exhaust system 8 includes an exhaust path 60 connected to the exhaust port 22 of the processing vessel 12. The exhaust system 8 is configured to exhaust the internal atmosphere of the processing vessel 12 along the exhaust path 60. More specifically, a pressure control valve 62, a trap mechanism 10, a vacuum pump 64 and an exhaust gas scrubber 66 are installed and interposed at the exhaust path 60 in the named order from the upstream side toward the downstream side. Manually-operated on/off valves 68 configured to close the exhaust path 60 when removing the trap mechanism 10 from the exhaust path 60 are respectively installed at opposite sides of the trap mechanism 10.

The pressure control valve 62 is formed of, e.g., a butterfly valve, and serves to control the internal pressure of the processing vessel 12. The vacuum pump 64 is formed of, e.g., a dry pump, and is configured to draw vacuum at the internal atmosphere of the processing vessel 12. A path heating heater 70 such as a tape heater or the like is installed and interposed at the exhaust path 60 extending from the exhaust port 22 of the processing vessel 12 to the trap mechanism 10 and the respective members installed and interposed at the exhaust path 60. The path heating heater 70 is configured to heat the exhaust gas to a predetermined temperature, thereby preventing a collection target gas contained in the exhaust gas from being liquefied during the exhaust process.

Figure 2:
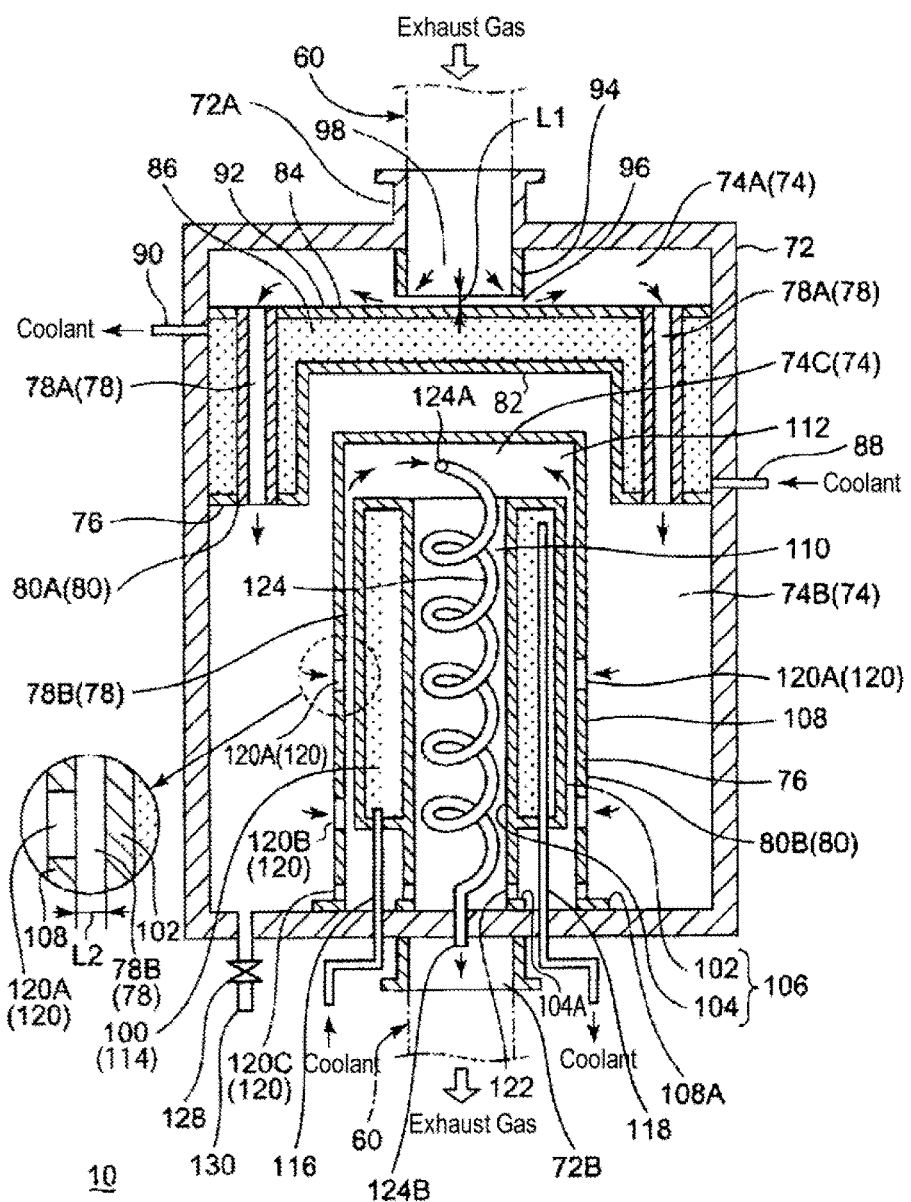
FIG. 2 is a vertical sectional view illustrating a trap mechanism according to one embodiment of the present disclosure.
Figure 3:
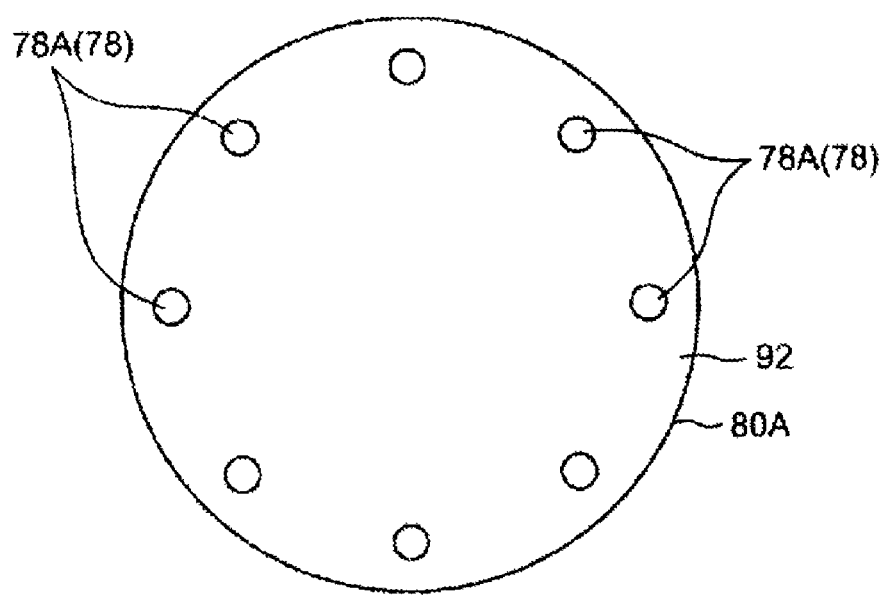
FIG. 3 is a plan view illustrating a first cooling jacket of the trap mechanism.
Figure 4:
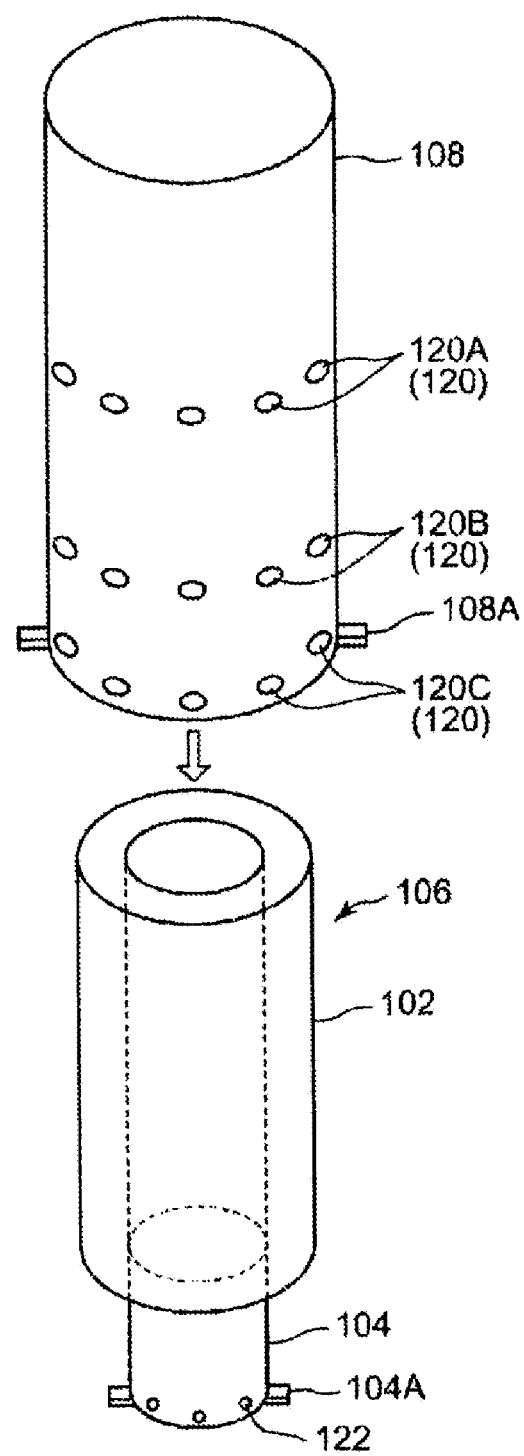
FIG. 4 is a disassembled perspective view illustrating a second cooling jacket of the trap mechanism.

Next, the trap mechanism 10 will be described. As mentioned above, the trap mechanism 10 is configured to re-liquefy the unreacted source gas and to recover the unreacted source gas from the exhaust gas. As shown in FIGS. 2 to 4, the trap mechanism 10 mainly includes a housing 72 that defines a shell of the trap mechanism 10 as a whole, a partitioning member 76 that divides the inside of the housing 72 into a plurality of retention (reservoir) spaces 74, communication paths 78 that bring the retention (reservoir) spaces 74 into communication with each other, and a cooling jacket unit 80 that cools the communication paths 78 in order to cool the exhaust gas.

In the present embodiment, the retention spaces 74 include three retention spaces, namely a first retention space 74A, a second retention space 74B and a third retention space 74C. In the order mentioned above, the respective retention spaces 74A to 74C are brought into serial communication with one another by the communication paths 78. The cooling jacket unit 80 includes a first cooling jacket 80A installed in the upper region within the housing 72 and a second cooling jacket 80B installed in the central region within the housing 72. The first cooling jacket 80A and the second cooling jacket 80B are all made of, e.g., stainless steel.

More specifically, the housing 72 is formed into a cylindrical shape by, e.g., a stainless steel. A gas inlet 72A is formed at the center of the ceiling portion of the housing 72. The upstream portion of the exhaust path 60 is connected to the gas inlet 72A. A gas outlet 72B is formed at the center of the bottom portion of the housing 72. The downstream portion of the exhaust path 60 is connected to the gas outlet 72B. Manually-operated on/off valves configured to completely seal the inside of the housing 72 when removing the trap mechanism 10 from the exhaust path 60 are respectively installed at the gas inlet 72A and the gas outlet 72B.

The size of the housing 72 is set such that the housing 72 has a diameter of, e.g., 20 to 40 cm and a height of, e.g., 20 to 50 cm. However, the size of the housing 72 is not limited to these dimensions. The first cooling jacket 80A serves as the partitioning member 76 that partitions the first retention space 74A and the second retention space 74B. As described above, the first cooling jacket 80A is horizontally installed at an upper portion within the housing 72 so as to extend across in the width-direction of the whole upper region of the housing 72. The first retention space 74A is defined above the first cooling jacket 80A. The second retention space 74B is defined below the first cooling jacket 80A.

The first cooling jacket 80A is defined by an upwardly-raised bottom partitioning wall 82 and a flat top partitioning wall 92. A coolant inlet 88 is installed at the lower portion of the first cooling jacket 80A and a coolant outlet 90 is installed in the upper portion of the first cooling jacket 80A, so that a coolant 86 can flow through the first cooling jacket 80A. The top partitioning wall 92 is installed to face toward the gas inlet 72A of the housing 72. A tubular gas introduction tube 94 extending from the gas inlet 72A toward the top partitioning wall 92 is installed at the gas inlet 72A.

The tip of the gas introduction tube 94 is adjacent to the top partitioning wall 92. Thus, a communication gap 96 as a narrow annular gap is formed between the tip of the gas introduction tube 94 and the top partitioning wall 92. Accordingly, an introduction space 98 inside the gas introduction tube 94 and the first retention space 74A outside the gas introduction tube 94 communicate with each other through the communication gap 96. In other words, the effective opening area of a path extending from the introduction space 98 to the first retention space 74A, namely the opening area of the communication gap 96, is small and therefore the exhaust conductance is small. Consequently, a pressure loss occurs. For that reason, the exhaust gas passing through the communication gap 96 is cooled by the top partitioning wall 92 and adiabatically expanded in the first retention space 74A. In this regard, the inner diameter of the exhaust path 60 (the gas introduction tube 94) is set to fall within a range of, e.g., about 40 to 60 mm, and the interval L1 of the communication gap 96 is set to fall within a range of, e.g., about 2 to 10 mm.

First communication paths 78A as the communication paths 78, which bring the first retention space 74A and the second retention space 74B into communication with each other, are formed at the first cooling jacket 80A. More specifically, the first communication paths 78A are installed to extend through the first cooling jacket 80A in an up-down direction. As shown in FIG. 3, the first communication paths 78A are disposed at a regular interval along a circumferential direction. While eight first communication paths 78A are disposed in FIG. 3, the number of the first communication paths 78A is not particularly limited. For example, the number of the first communication paths 78A may be set to fall within a range of 4 to 20, which depends on the inner diameter of the first communication paths 78A. The first communication paths 78A are made of a metal, e.g., stainless steel.

In the present embodiment, the first communication paths 78A linearly extend downward. In order to adjust the exhaust conductance, the first communication paths 78A may be bent in a curvilinear shape, e.g., in a meandering shape or a sinusoidal shape. The inner diameter of the first communication paths 78A is, e.g., 2 to 10 mm. The first communication paths 78A are sufficiently cooled by the first cooling jacket 80A. This makes it possible to sufficiently cool the exhaust gas that passes through the first communication paths 78A. The effective opening area of a path extending from the first retention space 74A to the second retention space 74B, namely the total flow path cross-sectional area of the first communication paths 78A, is small and therefore the exhaust conductance is small. Consequently, a pressure loss occurs. For that reason, the exhaust gas passing through the first communication paths 78A is cooled and adiabatically expanded in the second retention space 74B.

The second cooling jacket 80B is installed within the second retention space 74B. A second communication path 78B that brings the second retention space 74B and the third retention space 74C into communication with each other is formed in the second cooling jacket 80B. That is to say, the second cooling jacket 80B serves as the partitioning member 76. More specifically, the second cooling jacket 80B includes a tubular jacket body 106 which is formed of two jacket tubes 102 and 104 concentrically arranged with a cooling space portion 100 having a specified width interposed therebetween, and a roofed external tubular body 108 concentrically arranged around the jacket body 106 with a specified gap serving as the second communication path 78B interposed therebetween.

The third retention space 74C is formed of an inner space 110 of the tubular jacket body 106 and an upper space 112 of the external tubular body 108. In the present embodiment, as shown in FIG. 4, the jacket tubes 102 and 104 at both sides and the external tubular body 108 are respectively made of stainless steel and are formed into a cylindrical shape.

The upper end portions and the lower end portions of the jacket tubes 102 and 104 at both sides are connected to each other and sealed, such that the sealed internal space becomes the cooling space portion 100 having an annular shape. A coolant 114 flows through the cooling space portion 100. The inner jacket tube 104 of the jacket body 106 extends downward and is longer than the outer jacket tube 102 and is fixed to the bottom portion of the housing 72 by a bracket 104A. The lower end portion of the external tubular body 108 is also fixed to the bottom portion of the housing 72 by a bracket 108A.

A coolant introduction nozzle 116 configured to introduce a coolant from the outside into the jacket body 106 and a coolant discharge nozzle 118 configured to discharge the coolant to the outside are installed at the bottom portion of the jacket body 106. The tip of the coolant introduction nozzle 116 is positioned in a lower end region within the jacket body 106, and the tip of the coolant discharge nozzle 118 is positioned in an upper end region within the jacket body 106. Thus, the coolant 114 can be discharged in a state that the jacket body 106 is fully filled. Moreover, the coolant 114 discharged from the coolant discharge nozzle 118 may be guided to the coolant inlet 88 of the first cooling jacket 80A through a flow path (not shown) so that the coolant can be circulated.

As described above, the roofed external tubular body 108 is concentrically arranged around the jacket body 106 with a specified gap left therebetween, whereby the annular second communication path 78B having a small flow path cross-sectional area is formed between the outer circumference of the jacket body 106 and the inner circumference of the external tubular body 108. The width L2 of the second communication path 78B is, e.g., 1 to 5 mm. A plurality of communication holes 120 for bringing the second retention space 74B and the second communication path 78B into communication with each other is formed on the side surface of the external tubular body 108.

In this way, the communication holes 120 are formed on the side surface of the external tubular body 108. Thus, the outer circumferential surface of the jacket body 106 exists in the flow direction of the exhaust gas introduced from the communication holes 120. This enables the exhaust gas to actively impinge against the outer circumferential surface of the jacket body 106. In the present embodiment, the communication holes 120 are formed of three groups of communication holes which are respectively positioned in the middle portion, the lower end portion and the lowermost position of the external tubular body 108 along the height direction thereof. That is to say, the communication holes 120 are divided and grouped into middle communication holes 120A, lower-end communication holes 120B and lowermost communication holes 120C.

The plurality of, e.g., about ten, middle communication holes 120A, the lower-end communication holes 120B and the lowermost communication holes 120C are respectively formed at a regular interval along the circumferential direction of the external tubular body 108. Thus, the exhaust gas introduced from the second retention space 74B into the second communication path 78B through the respective communication holes 120A to 120C flows upward through the second communication path 78B and comes into the third retention space 74C. The diameter of the respective communication holes 120A to 120C may be, but not particularly limited to, e.g., about 2 to 5 mm.

Accordingly, the effective opening area, i.e., the total flow path cross-sectional area, of a path extending from the second retention space 74B to the third retention space 74C is small and therefore the exhaust conductance is small. Consequently, a pressure loss occurs. For that reason, the exhaust gas passing through the second communication path 78B is cooled and adiabatically expanded in the third retention space 74C. Since the groups of the communication holes 120 differing in height position are formed in the external tubular body 108, the exhaust conductance of the second communication path 78B decreases stepwise as the amount of a retention liquid 140 retained within the housing 72 increases and the liquid level goes up. Thus, the exhaust conductance of the trap mechanism 10 also decreases stepwise. The stepwise change of the exhaust conductance affects the opening degree of the pressure control valve 62 and the internal pressure value of the processing vessel 12 in a stepwise manner. By monitoring the opening degree of the pressure control valve 62 and/or the internal pressure value of the processing vessel 12, it is possible to indirectly detect the amount of the retention liquid 140 retained within the housing 72. This makes it possible to detect the necessity of replacement of the trap mechanism 10.

Liquid flow holes 122 which bring the bottom regions of the third retention space 74C and the second retention space 74B into communication with each other and which allow the recovered retention liquid to pass therethrough are formed at the lower end portion of the inner jacket tube 104 of the jacket body 106. If the level of the recovered retention liquid increases only a little bit, the liquid flow holes 122 are immediately filled with the retention liquid 140. Thus, the movement of the exhaust gas between the second retention space 74B and the third retention space 74C is cut off. Although the accommodation amount of the retention liquid is reduced, the liquid flow holes 122 may not be formed.

A gas discharge path 124 extending in an up-down direction is installed within the third retention space 74C. The gas discharge path 124 is made of, e.g., stainless steel. A gas intake hole 124A formed at the upper end portion of the gas discharge path 124 is positioned in the upper region within the third retention space 74C. The gas discharge path 124 extends through the bottom portion of the housing 72. A gas exhaust hole 124B formed at the lower end portion of the gas discharge path 124 is positioned within the gas outlet 72B installed below and outside the housing 72. Thus, the exhaust gas within the third retention space 74C can be discharged out of the housing 72. In the present embodiment, for the purpose of reducing the exhaust conductance of the gas discharge path 124, the gas discharge path 124 is helically bent and wound to prolong the length thereof. Alternatively, the gas discharge path 124 may be formed into a linear shape. The inner diameter of the gas discharge path 124 is, e.g., about 2 to 10 mm.

Accordingly, the effective opening area of a path extending from the third retention space 74C to the vacuum pump 64 (see FIG. 1) arranged outside the housing 72, namely the flow path cross-sectional area of the gas discharge path 124, becomes smaller. Thus, the exhaust conductance becomes smaller such that a pressure loss occurs. As shown in FIG. 2, an exhaust nozzle 130 provided with an on/off valve 128 is installed at the bottom portion of the housing 72 in order to exhaust the recovered retention liquid out of the housing 72.

The overall operation of the film formation device 2 configured as above, e.g., the start and stop of the supply of gases, the process temperature, the process pressure, the supply of the coolant at the trap mechanism 10, and the circulation of the coolant, are controlled by a device control unit 132 (see FIG. 1) formed of, e.g., a computer.

A computer-readable program required in this control is stored in a storage medium 134. As the storage medium 134, it is possible to use a flexible disk, a CD (Compact Disc), a CD-ROM, a hard disk, a flash memory, a DVD, or the like.

<Film Formation Method and Operation of Trap Mechanism>

Figure 5:
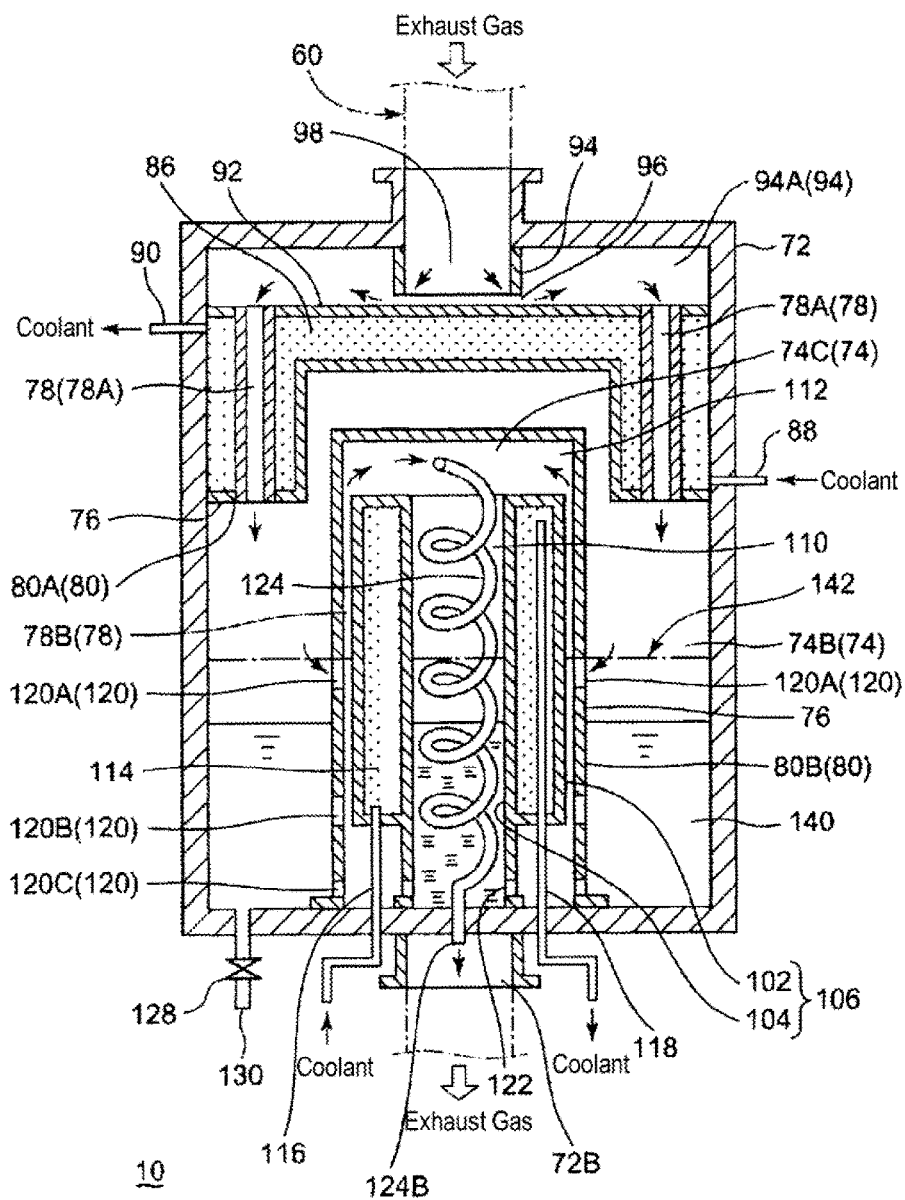
FIG. 5 is a sectional view illustrating a state in which accumulated liquid is being stored in the trap mechanism.

Next, a film formation method implemented by the film formation device 2 configured as above and an operation of the trap mechanism 10 will be described with reference to FIG. 5. FIG. 5 is a sectional view illustrating a state in which retention liquid is being accumulated in the trap mechanism 10. As shown in FIG. 1, the vacuum pump 64 of the exhaust system 8 is continuously operated such that the inside of the processing vessel 12 of the film formation device body 4 of the film formation device 2 is vacuum drawn and kept at a predetermined pressure. Furthermore, the semiconductor wafer W supported on the mounting stand structure 14 is kept at a predetermined temperature by the heater 18. The sidewall of the processing vessel 12 and the shower head 26 are kept at a predetermined temperature by the heaters 32 and 34, respectively. The predetermined temperature is set to fall within a temperature range equal to or higher than a liquefying temperature of a source gas.

The entirety of the gas supply system 6 is heated in advance to a predetermined temperature by the tank heating unit 56 or the path heating heater 58. If film formation is started, a flow-rate-controlled carrier gas is supplied into the raw material tank 36 of the gas supply system 6 through the carrier gas pipe 46, whereby the vaporized and saturated source gas existing at the upper space portion 50 within the raw material tank 36 flows toward the downstream side through the raw material path 42 together with the carrier gas.

The source gas is introduced from the shower head 26 of the film formation device body 4 into the processing vessel 12 kept in a depressurized atmosphere. Within the processing vessel 12, a thin film of Ru metal is formed on the semiconductor wafer W by, e.g., a CVD (Chemical Vapor Deposition) method. At this time, the process conditions are set such that the process pressure is equal to about 50 Torr (6665 Pa).

At this time, the liquid raw material 38 unreacted within the processing vessel 12 flows down through the exhaust path 60 of the exhaust system 8 together with the carrier gas. The exhaust path 60 is heated by the path heating heater 70. Thus, the source gas is prevented from being re-liquefied and kept in a gas state. The exhaust gas flowing down through the exhaust path 60 is discharged to the atmosphere after sequentially passing through the pressure control valve 62, the trap mechanism 10, the vacuum pump 64 and the exhaust gas scrubber 66.

Now, description will be made on the operation of the trap mechanism 10 configured to liquefy and recover an unreacted gas as a collection target gas. A coolant, e.g., cooling water, flows through the first cooling jacket 80A and the second cooling jacket 80B of the trap mechanism 10 in order to cool the cooling jackets 80A and 80B. The coolant is not limited to the cooling water and any other coolant may be used.

First, the exhaust gas flowing through the exhaust path 60 is introduced into the housing 72 from the gas inlet 72A installed at the top portion of the housing 72. The exhaust gas is diffused and flows from the introduction space 98 just below the gas inlet 72A into the first retention space 74A through the narrow annular communication gap 96 formed between the gas introduction tube 94 and the top partitioning wall 92 of the first cooling jacket 80A. At this time, the exhaust gas flowing through the communication gap 96 is efficiently brought into contact or collision with the top partitioning wall 92 and is sufficiently cooled. Moreover, the exhaust gas is adiabatically expanded when introduced into the first retention space 74A. Thus, the temperature of the exhaust gas is reduced. As a result, the source gas contained in the exhaust gas is partially liquefied.

The exhaust gas within the first retention space 74A enters the first communication paths 78A formed at the first cooling jacket 80A and flows downward through the first communication paths 78A while being cooled. Then, the exhaust gas is introduced into the second retention space 74B. The exhaust gas flowing through the first communication paths 78A is efficiently brought into contact with the cooled wall surfaces of the first communication paths 78A and is sufficiently cooled. Moreover, the exhaust gas is adiabatically expanded again when introduced into the second retention space 74B. Thus, the temperature of the exhaust gas is reduced. As a result, the source gas contained in the exhaust gas is partially liquefied.

The exhaust gas within the second retention space 74B enters the narrow annular second communication path 78B through the respective communication holes 120 formed at the external tubular body 108 of the second cooling jacket 80B. The exhaust gas flows upward through the second communication path 78B while being cooled. Thus, the exhaust gas flows into the third retention space 74C.

The exhaust gas flowing through the second communication path 78B is efficiently brought into contact with the outer wall surface of the outer jacket tube 102 of the jacket body 106 and is sufficiently cooled. Moreover, the exhaust gas is adiabatically expanded for the third time when introduced into the third retention space 74C. Thus, the temperature of the exhaust gas is reduced. As a result, the source gas contained in the exhaust gas is mostly liquefied.

Then, the exhaust gas within the third retention space 74C flows into the gas discharge path 124 from the gas intake hole 124A positioned in the upper region within the third retention space 74C. The exhaust gas flows downward through the gas discharge path 124 and is discharged into the gas outlet 72B from the gas exhaust hole 124B. At this time, the exhaust gas is adiabatically expanded. Then, the exhaust gas flows toward the downstream side of the exhaust path 60. The raw material cooled and liquefied within the first to third retention spaces 74A, 74B and 74C flows downward along the wall surfaces that define the first communication paths 78A and the second communication path 78B. The raw material as a retention liquid 140 (see FIG. 5) is accumulated little by little at the bottom portion of the housing 72. Thus, the level of the retention liquid 140 goes up little by little.

In this case, the second retention space 74B and the third retention space 74C communicate with each other through the lowermost communication holes 120C formed at the lower end portion of the external tubular body 108 and the liquid flow holes 122 formed at the lower end portion of the inner jacket tube 104. Thus, the retention liquid 140 is accumulated within the retention spaces 74B and 74C while flowing between the retention spaces 74B and 74C. The liquid level 142 of the retention liquid 140 within the retention spaces 74B and 74C goes up while being kept at the same height.

When the amount of the retention liquid 140 within the housing 72 is substantially zero, as described above, the second retention space 74B and the third retention space 74C communicate with each other through the lowermost communication holes 120C and the liquid flow holes 122 of the inner jacket tube 104. Thus, the exhaust gas within the second retention space 74B is partially introduced into the third retention space 74C without going through the second communication path 78B. However, if only a little amount of the retention liquid 140 is accumulated so as to block the liquid flow holes 122, the second retention space 74B and the third retention space 74C are completely isolated from each other. Thus, no serious problem occurs.

When the amount of the retention liquid 140 within the housing 72 increases and when the liquid level 142 reaches a level at which the uppermost middle communication holes 120A among the communication holes 120 formed at the external tubular body 108 are closed as indicated by a single-dot chain line in FIG. 5, the exhaust gas ceases to flow. Thus, the collecting operation is stopped. Here, the gas intake hole 124A formed at the upper end portion of the gas discharge path 124 is positioned higher than the uppermost middle communication holes 120A among the communication holes 120 formed at the external tubular body 108. Thus, there is no case where the retention liquid 140 flows toward the downstream side of the exhaust gas flow path.

As described above, in the aforementioned embodiment, pressure losses are generated by providing the portions in which the exhaust conductance becomes smaller at multiple stages, such as the communication gap 96, the first communication paths 78A and the second communication path 78B. In the respective portions, the exhaust gas is brought into contact with the cooled wall surfaces at multiple stages, e.g., three stages, thereby efficiently cooling the exhaust gas. Moreover, the exhaust gas is adiabatically expanded at the respective stages, eventually liquefying the source gas as a collection target gas. This makes it possible to efficiently recover the raw material.

In this regard, in some embodiment, the exhaust conductance is adjusted by changing the path length (gap width) or the path number such that a pressure loss of 10 Torr (1333 Pa) or more is generated at the communication gap 96, the first communication paths 78A, the second communication path 78B and the gas discharge path 124, respectively.

According to the aforementioned embodiment, the trap mechanism 10 includes the housing 72 having the gas inlet 72A and the gas outlet 72B, the partitioning member 76 configured to partition the inside of the housing 72 into a plurality of retention spaces 74A to 74C, the communication paths 78 (78A and 78B) configured to bring the retention spaces 74A to 74C into communication with one another, and the cooling jacket unit 80 configured to cool the communication paths 78 (78A and 78B) in order to cool the exhaust gas. The exhaust gas is caused to sequentially flow into the respective retention spaces 74A to 74C through the communication paths 78 (78A and 78B). Thus, while cooling the exhaust gas, the exhaust gas is adiabatically expanded by changing the exhaust conductance. This makes it possible to efficiently cool and liquefy the collection target gas and to efficiently collect the collection target matter.

In the aforementioned embodiment, the gas introduction tube 94 is installed at the gas inlet 72A. However, the gas introduction tube 94 may not be installed and may be omitted. In the aforementioned embodiment, there are installed the first cooling jacket 80A and the second cooling jacket 80B. However, as shown in FIG. 8, the first cooling jacket 80A (including the first communication paths 78A) may not be installed, and the first retention space 74A and the second retention space 74B may be merged into a single retention space 74AB.

In the aforementioned embodiment, the coolant may be supplied to only the first cooling jacket 80A and may not be supplied to the second cooling jacket 80B. In the aforementioned embodiment, the unreacted raw material is recovered by collecting the source gas as the collection target gas. However, the collection target matter is not limited thereto. Regardless of the kind of the collection target matter, it may be possible to collect any liquid-phase raw material or any liquid-phase reaction byproduct.

<Detailed Description of Exhaust System>

Next, description will be made on the specific configuration of the exhaust system. In reality, based on necessity, a cleaning gas, a purge gas or the like is introduced into the processing vessel. For that reason, a bypass path for, during a cleaning process, allowing a cleaning gas to avoid the trap mechanism 10 without passing through the inside of the trap mechanism 10 is formed in the exhaust system. The flow path of a gas is switched by operating an on/off valve.

In this case, the cleaning gas easily reacts with the collection target gas or the collection target matter within the trap mechanism 10. It is therefore necessary to prevent the cleaning gas, even in a small amount, from seeping into the trap mechanism 10. However, there is a possibility that a leakage of the cleaning gas, albeit very small in amount, actually occurs at the on/off valve. Thus, there is a concern that a small amount of the cleaning gas leaked at the on/off valve is diffused little by little and seeps into the trap mechanism 10. The exhaust system disclosed herein is configured to reliably prevent the cleaning gas from seeping into the trap mechanism 10 even when a small amount of the cleaning gas is leaked at the on/off valve.

Figure 6:
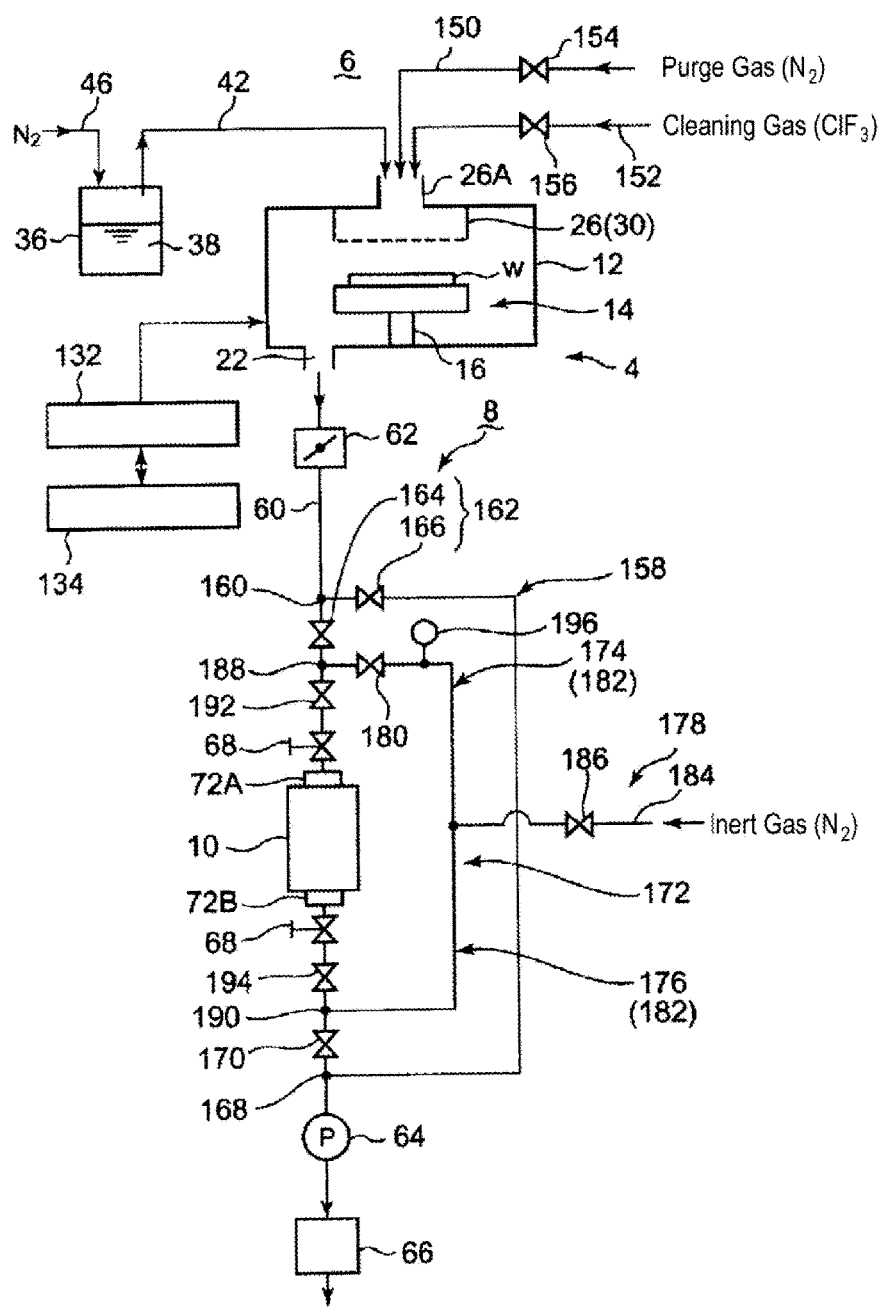
FIG. 6 is a schematic configuration diagram illustrating the entirety of a film formation device provided with an exhaust system according to the present disclosure.
Figure 7A:
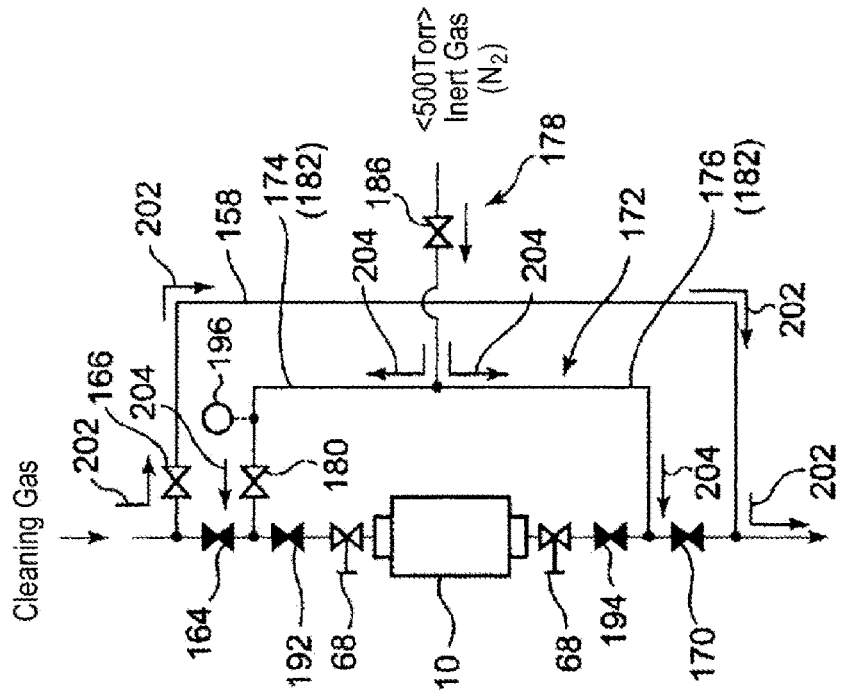
FIGS. 7A and 7B are explanatory views for explaining the flow of a gas that flows within the exhaust system.
Figure 7B:
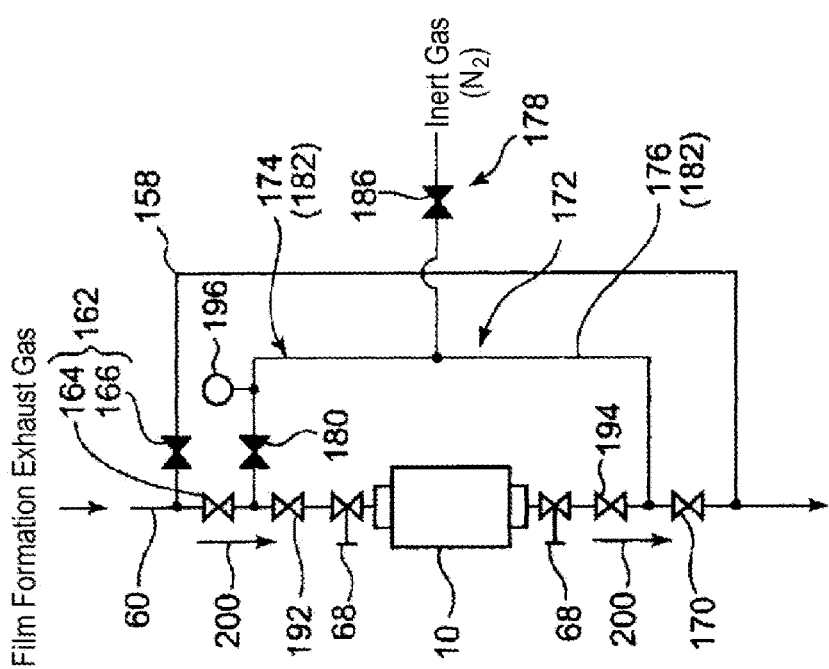

FIG. 6 is a schematic configuration diagram illustrating the entirety of a film formation device provided with this exhaust system. FIGS. 7A and 7B are explanatory views for explaining the flow of a gas that flows through the exhaust system. The film formation device shown in FIG. 6 is completely identical with the film formation device illustrated in FIG. 1, except the exhaust system 8. In FIG. 6, the film formation device is shown in a simplified manner. The component parts identical with those illustrated in FIG. 1 are designated by like reference symbols.

In the processing vessel 12 of the film formation device body 4 shown in FIG. 6, a purge gas supply system 150 for supplying a purge gas and a cleaning gas supply system 152 for supplying a cleaning gas, both of which constitute the gas supply system 6, are installed at the shower head 26. Then, on/off valves 154 and 156 are installed and interposed at the respective gas paths. Thus, if necessary, the cleaning gas or the purge gas can be supplied to the shower head 26 while controlling the flow rate thereof. In the present embodiment, for example, a $N_2$ gas is used as the purge gas. However, the purge gas is not limited thereto. It may be possible to use a rare gas such as an Ar gas or the like. In addition, for example, a $ClF_3$ gas is used as the cleaning gas.

In the exhaust system 8, a bypass path 158 is connected to an intermediate portion of the exhaust path 60 so as to avoid (detour) the trap mechanism 10. The bypass path 158 is connected to the exhaust path 60 at the upstream side and the downstream side of the trap mechanism 10. A switching valve mechanism 162 configured to switch the flow of the exhaust gas between the exhaust path 60 and the bypass path 158 is installed at a connection portion 160 existing at the upstream side of the bypass path 158.

The switching valve mechanism 162 includes a first on/off valve 164 installed at the exhaust path 60 at the downstream side of the connection portion 160 and a second on/off valve 166 installed at the bypass path 158. The switching valve mechanism 162 is configured to switch the flow of the exhaust gas as mentioned above by switching the opening/closing states of the on/off valves 164 and 166. A three-way valve may be provided in place of the first on/off valve 164 and the second on/off valve 166.

An inflow-preventing on/off valve 170 configured to prevent backflow of the cleaning gas is installed at the intermediate portion of the exhaust path 60 at the upstream side of another connection portion 168 that exists at the downstream side of the bypass path 158. Moreover, an inert gas supply unit 172 is installed, when the exhaust gas is caused to flow through the bypass path 158, to supply an inert gas having a pressure higher than the pressure of the exhaust gas, into the exhaust path 60 between the gas inlet 72A of the trap mechanism 10 and the connection portion 160 at the upstream side of the bypass path 158 and into the exhaust path 60 between the gas outlet 72B of the trap mechanism 10 and another connection portion 168 at the downstream side of the bypass path 158.

More specifically, the inert gas supply unit 172 includes a first pressurizing gas path 174 connected to the exhaust path 60 at downstream of the first on/off valve 164 which exists between the gas inlet 72A and the upstream-side connection portion 160, a second pressurizing gas path 176 connected to the exhaust path 60 at the upstream side of the inflow-preventing on/off valve 170 which exists between the gas outlet 72B and the downstream-side another connection portion 168, and an inert gas supply unit 178 configured to supply an inert gas into the first and second pressurizing gas paths 174 and 176.

A gas-supplying on/off valve 180 which is opened when supplying the inert gas and which is kept closed in other cases is installed at the intermediate portion of the first pressurizing gas path 174. In the present embodiment, the first pressurizing gas path 174 and the second pressurizing gas path 176 are in communication with each other and installed as a single common gas path 182. The inert gas supply unit 178 is connected to the common gas path 182 and used in common.

An on/off valve 186 is installed at a gas supply path 184 of the inert gas supply unit 178 such that an inert gas can be supplied based on necessity. In the present embodiment, an $N_2$ gas is used as the inert gas. However, a rare gas such as an Ar gas or the like may be used in place of the $N_2$ gas. In this regard, the internal pressure of the exhaust path 60 varies depending on the kind of processing and is, e.g., about 400 Torr (53328.9 Pa) at most. In contrast, the pressure of the inert gas is set as high as 500 Torr (66661.2 Pa).

Backflow-preventing on/off valves 192 and 194 are installed at the intermediate portion of the exhaust path 60 at the downstream side of a connection portion 188 at which the first pressurizing gas path 174 is connected to the exhaust path 60, and at the intermediate portion of the exhaust path 60 at the upstream side of a connection portion 190 at which the second pressurizing gas path 176 is connected to the exhaust path 60, respectively.

For example, when an exhaust cleaning gas is caused to flow through the bypass path 158, an inert gas having, e.g., a pressure of 500 Torr (66661.2 Pa) higher than the pressure of the exhaust gas, is supplied to the common gas path 182, namely the first and second pressurizing gas paths 174 and 176. The high-pressure inert gas is introduced into and enclosed within the exhaust path 60 extending between the first on/off valve 164 and the backflow-preventing on/off valve 192 installed at the upstream side of the trap mechanism 10. The high-pressure inert gas is also introduced into and enclosed within the exhaust path 60 extending between the backflow-preventing on/off valve 194 and the inflow-preventing on/off valve 170 installed at the downstream side of the trap mechanism 10. Thus, the cleaning gas is prevented from being introduced or diffused into the trap mechanism 10 even in a small amount.

A manometer 196 is installed at the common gas path 182 to monitor pressure fluctuation within the common gas path 182. This makes it possible to check leakage of the inert gas. The opening/closing operations of the respective on/off valves are controlled by, e.g., the instructions transmitted from the device control unit 132.

Next, the operation of the exhaust system will be described with reference to FIGS. 7A and 7B. FIG. 7A shows the flow of the exhaust gas during a film formation process and FIG. 7B shows the flow of the exhaust gas during a cleaning process. In FIGS. 7A and 7B, the white symbols of the respective on/off valves indicate an "open state" and the black symbols of the respective on/off valves indicate a "closed state".

During a film formation process for forming a thin film, as shown in FIG. 7A, the exhaust gas is allowed to flow through the trap mechanism 10 and prevented from flowing through the bypass path 158. In this case, the inert gas supply unit 172 is not operated. That is to say, the second on/off valve 166 of the switching valve mechanism 162, the gas-supplying on/off valve 180 of the first pressurizing gas path 174 and the on/off valve 186 of the inert gas supply unit 178 are all kept closed. In contrast, the first on/off valve 164 of the switching valve mechanism 162, the backflow-preventing on/off valves 192 and 194 at the upstream and downstream sides of the trap mechanism 10, and the inflow-preventing on/off valve 170 are all kept open.

Thus, as indicated by an arrow 200, the film formation exhaust gas flows along the exhaust path 60 and flows into the trap mechanism 10. Within the trap mechanism 10, as mentioned above, the collection target gas contained in the exhaust gas is cooled and the collection target matter is removed. The exhaust gas flowing out of the trap mechanism 10 flows toward the downstream side directly.

In contrast, when cleaning the inside of the processing vessel 12, as shown in FIG. 7B, the exhaust gas is prevented from flowing through the trap mechanism 10 and the cleaning gas as the exhaust gas is allowed to flow through the bypass path 158, in the opposite manner to the above case. In this case, the inert gas supply unit 172 is operated. That is to say, the second on/off valve 166 of the switching valve mechanism 162, the gas-supplying on/off valve 180 of the first pressurizing gas path 174 and the on/off valve 186 of the inert gas supply unit 178 are all kept open. In contrast, the first on/off valve 164 of the switching valve mechanism 162, the backflow-preventing on/off valves 192 and 194 at the upstream and downstream sides of the trap mechanism 10, and the inflow-preventing on/off valve 170 are all kept closed.

Thus, as indicated by an arrow 202, the exhaust gas including the cleaning gas used in the cleaning process flows from the exhaust path 60 toward the bypass path 158 and does not flow into the trap mechanism 10. At this time, as mentioned above, an $N_2$ gas having a pressure higher than the pressure of the exhaust gas including the cleaning gas is supplied from the inert gas supply unit 178 as indicated by an arrow 204. The $N_2$ gas is introduced into the exhaust path 60 through the first and second pressurizing gas paths 174 and 176, namely the common gas path 182.

As a result, the inert gas is introduced into the portion of the exhaust path 60 extending between the first on/off valve 164 and the backflow-preventing on/off valve 192 installed at the upstream side of the trap mechanism 10 and is introduced into the portion of the exhaust path 60 extending between the backflow-preventing on/off valve 194 and the inflow-preventing on/off valve 170 installed at the downstream side of the trap mechanism 10. The inert gas is enclosed within the portions of the exhaust path 60 with the pressure thereof kept higher than the pressure of the exhaust gas including the cleaning gas.

Accordingly, even if there is a little bit of leakage at the first on/off valve 164 or the inflow-preventing on/off valve 170, the $N_2$ gas supplied from the inert gas supply unit 178 flows toward the exhaust gas having a low pressure. As a consequence, it is possible to reliably prevent the cleaning gas from being leaked, diffused and mixed into the trap mechanism 10. Furthermore, even if there is a little bit of leakage at the backflow-preventing on/off valves 192 and 194 positioned closer to the trap mechanism 10, only a small amount of the $N_2$ gas as the inert gas flows into the trap mechanism 10. Therefore, no serious problem occurs. In this regard, the pressure of the $N_2$ gas is, e.g., 500 Torr (66661.2 Pa), whereas the pressure of the exhaust gas including the cleaning gas is about 50 to 400 Torr (6666.12 to 53328.9 Pa).

As mentioned above, the exhaust gas may be caused to flow through the bypass path 158 in processes other than the cleaning process. For example, a purge gas is supplied into the processing vessel 12 when a semiconductor wafer W is carried into and out of the processing vessel 12. Therefore, the bypass path 158 may be used when discharging the purge gas. In the present embodiment, the inert gas having a pressure of 500 Torr (66661.2 Pa) is supplied into the common gas path 182. However, the pressure of the inert gas supplied into the common gas path 182 is not limited to 500 Torr (66661.2 Pa). It is only necessary that the pressure of the inert gas be higher than the pressure of the exhaust gas flowing through the bypass path 158.

In the present embodiment, the common gas path 182 including the first and second pressurizing gas paths 174 and 176 in communication with each other is used and one inert gas supply unit 178 is connected to the common gas path 182. Alternatively, the first and second pressurizing gas paths 174 and 176 may be installed independently of each other and the inert gas supply units may be installed at the respective pressurizing gas paths 174 and 176.

In the present embodiment, a $ClF_3$ gas is used as the cleaning gas. However, the cleaning gas is not limited thereto. It may be possible to use other chlorine-based gases, fluorine-based gases such as a $NF_3$ gas and the like, or ozone. In the present embodiment, the gas-supplying on/off valve 180 and the backflow-preventing on/off valve 192 are installed independently of each other. Alternatively, the gas-supplying on/off valve 180 and the backflow-preventing on/off valve 192 may be merged into and used as a three-way valve.

In the aforementioned embodiment, the workpiece is a semiconductor wafer. The semiconductor wafer includes a silicon substrate and a chemical compound semiconductor substrate which is made of GaAs, SiC, GaN or the like. In addition, the workpiece may be a glass substrate used in a liquid crystal display, or a ceramic substrate.

What is claimed is:

1. A trap mechanism located at an exhaust path through which an exhaust gas is discharged from a film formation device body configured to form a thin film on a surface of a workpiece flows, the trap mechanism being configured to cool, liquefy and recover a collection target gas contained in the exhaust gas, the trap mechanism comprising:
   a housing having a gas inlet and a gas outlet;
   a partitioning member configured to divide an inside of the housing into a plurality of retention spaces;
   a communication path configured to bring the retention spaces into communication with one another; and
   a cooling jacket unit configured to cool the communication path to thereby cool the exhaust gas,
   wherein the retention spaces include a first retention space, a second retention space and a third retention space which are serially connected to one another, and
   wherein the cooling jacket unit includes a first cooling jacket and a second cooling jacket, wherein the exhaust gas flows from the first retention space to the second retention space in a first up-down direction, wherein the exhaust gas flows from the second retention space to the third retention space in a second up-down direction which is opposite to the first up-down direction, wherein the first cooling jacket includes a first communication path configured to bring the first retention space and the second retention space into communication with each other, wherein the first communication path is fully surrounded by the first cooling jacket, and wherein the first cooling jacket includes a top partitioning wall, a front surface of the top partitioning wall facing the gas inlet such that the first retention space and the second retention space are partitioned, wherein the second cooling jacket is installed within the second retention space, the second cooling jacket including a tubular jacket body through which a coolant flows and a roofed external tubular body concentrically disposed around the tubular jacket body to form a second communication path between the roofed external tubular body and the tubular jacket body, wherein the third retention space is formed in an inner space of the tubular jacket body and an upper space of the roofed external tubular body, wherein a plurality of communication holes is formed through the roofed external tubular body at different vertical positions to communicate with the second communication path so that conductance of the second communication path varies depending upon a level of liquefied target gas within the housing, and wherein a gas discharge tube is formed at the third retention space, a top portion of the gas discharge tube having a gas intake hole positioned in an upper region within the third retention space so that the liquefied target gas does not block the gas intake hole of the discharge tube and a bottom portion of the gas discharge tube communicating with the gas outlet.

2. The trap mechanism of claim 1, wherein the first cooling jacket serving as the partitioning member configured to divide the inside of the housing into the first retention space and the second retention space which is positioned below the first retention space.

3. The trap mechanism of claim 2, wherein a gas introduction tube is installed at the gas inlet, the gas introduction tube extending toward the top partitioning wall of the first cooling jacket, the gas introduction tube having a tip portion which is adjacent to the top partitioning wall to form a communication gap between the tip portion and the top partitioning wall, the communication gap communicating with the first retention space.

4. The trap mechanism of claim 2, wherein the first communication path is bent.

5. The trap mechanism of claim 2, wherein the first communication path is installed in a multiple number.

6. The trap mechanism of claim 1, wherein the second communication path and the plurality of communication holes are configured to bring the second retention space and the third retention space into communication with each other and the second cooling jacket serves as the partitioning member that partitions the second retention space and the third retention space.

7. The trap mechanism of claim 1, wherein the exhaust gas is adiabatically expanded within the first retention space, the second retention space and the third retention space.

8. An exhaust system through which an exhaust gas is discharged from a film formation device body configured to form a thin film on a surface of a workpiece flows, the exhaust system comprising:
an exhaust path connected to an exhaust port of the film formation device body;
a vacuum pump located at the exhaust path;
trap mechanism of claim 1 located at the exhaust path at an upstream side of the vacuum pump;
a bypass path connected to the exhaust path so as to avoid the trap mechanism; and
an inert gas supply unit configured to supply an inert gas into the exhaust path between a gas inlet of the trap mechanism and a first connection portion existing at an upstream side of the bypass path and into the exhaust path between a gas outlet of the trap mechanism and a second connection portion existing at a downstream side of the bypass path,
wherein the inert gas has a pressure higher than a pressure of the exhaust gas flowing through the bypass path.

9. The exhaust system of claim 8, wherein a switching valve mechanism configured to switch the flow of the exhaust gas between the exhaust path and the bypass path is located at the first connection portion at the upstream side of the bypass path.

10. The exhaust system of claim 9, wherein the switching valve mechanism includes a first on/off valve located at the exhaust path and a second on/off valve installed at the bypass path.

11. The exhaust system of claim 8, wherein an inflow-preventing on/off valve is located at the exhaust path at an upstream side of the second connection portion existing at the downstream side of the bypass path.

12. The exhaust system of claim 8, wherein the inert gas supply unit includes: a first pressurizing gas path connected to the exhaust path that extends between the gas inlet and the first connection portion at the upstream side of the bypass path;
a second pressurizing gas path connected to the exhaust path that extend between the gas outlet and the second connection portion at the downstream side of the bypass path; and
an inert gas supply unit configured to supply an inert gas into the first pressurizing gas path and the second pressurizing gas path.

13. The exhaust system of claim 12, wherein a gas-supplying on/off valve is located at the first pressurizing gas path.

14. The exhaust system of claim 12, wherein the first pressurizing gas path and the second pressurizing gas path are in communication with each other.

15. The exhaust system of claim 12, wherein backflow-preventing on/off valves are respectively located at the exhaust path at a downstream side of a third connection portion at which the first pressurizing gas path is connected to the exhaust path, and located at the exhaust path at an upstream side of a fourth connection portion at which the second pressurizing gas path is connected to the exhaust path.

16. The exhaust system of claim 8, wherein a pressure control valve and an exhaust gas scrubber are located at the exhaust path.

17. A film formation device of forming a thin film on a surface of a workpiece, comprising:
a film formation device body including a processing vessel capable of being vacuum-exhausted;

a mounting stand structure configured to mount the workpiece thereon;
a gas introduction unit configured to introduce a gas into the processing vessel;
a gas supply system connected to the gas introduction unit and configured to supply the gas to the gas introduction unit; and
the exhaust system of claim 8 configured to exhaust an internal atmosphere of the processing vessel.

* * * * *